United States Patent
Kim et al.

(10) Patent No.: US 9,868,878 B2
(45) Date of Patent: Jan. 16, 2018

(54) ADHESIVE COMPOSITION AND DISPLAY DEVICE

(71) Applicants: SAMSUNG DISPLAY CO., LTD., Yongin-si, Gyeonggi-do (KR); Seoul National University R&DB Foundation, Seoul (KR)

(72) Inventors: Youngkwan Kim, Seoul (KR); Hyunjoong Kim, Seoul (KR); Donghun No, Cheongju-si (KR); Jiwon Park, Seoul (KR); Sangeun Moon, Suwon-si (KR); Jonggyu Lee, Seoul (KR)

(73) Assignees: Samsung Display Co., Ltd., Yongin-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 15/213,164

(22) Filed: Jul. 18, 2016

(65) Prior Publication Data

US 2017/0022393 A1  Jan. 26, 2017

(30) Foreign Application Priority Data

Jul. 20, 2015 (KR) .......................... 10-2015-0102478

(51) Int. Cl.
*H01L 23/52* (2006.01)
*H01L 21/00* (2006.01)
(Continued)

(52) U.S. Cl.
CPC ............... *C09J 4/00* (2013.01); *C08F 220/18* (2013.01); *C09J 5/06* (2013.01); *H01L 24/26* (2013.01); *C09J 2203/326* (2013.01)

(58) Field of Classification Search
CPC ....................................................... H01L 24/26
(Continued)

(56) References Cited

U.S. PATENT DOCUMENTS 6,207,272 B1 * 3/2001 Takahira ................. C09J 7/0217
  428/355
7,527,753 B2 * 5/2009 Hiroshige ........... H01L 23/3737
  252/518.1
(Continued)

FOREIGN PATENT DOCUMENTS

JP  10-316953  * 12/1998  ............ C09J 133/06
JP  2004-059851  * 2/2004  ................ C09J 4/02
(Continued)

*Primary Examiner* — Calvin Lee
(74) *Attorney, Agent, or Firm* — Lewis Roca Rothgerber Christie LLP

(57) ABSTRACT

A display device includes: a display panel; a window on a surface of the display panel; and an adhesive layer between the display panel and the window, wherein the adhesive layer includes, with respect to a total weight of the adhesive composition: a binder in an amount of about 65 percent by weight (wt %) to about 80 wt %; a reactive monomer in an amount of about 15 wt % to about 25 wt %; a photopolymerization initiator in an amount of about 1 wt % to about 10 wt %; a thermal polymerization initiator in an amount of about 0.5 wt % to about 1 wt %; and a curing accelerator in an amount of about 0.1 wt % to about 0.5 wt %, wherein the curing accelerator includes a metallic acrylate.

20 Claims, 4 Drawing Sheets

(51) Int. Cl.
    *C09J 4/00*     (2006.01)
    *H01L 23/00*     (2006.01)
    *C09J 5/06*     (2006.01)
    *C08F 220/18*     (2006.01)

(58) Field of Classification Search
    USPC .................. 438/118, 628, 644, 654; 257/753
    See application file for complete search history.

(56) References Cited

U.S. PATENT DOCUMENTS

| | | | |
|---|---|---|---|
| 8,148,444 B2 * | 4/2012 | Yoda .................... | C08K 3/0033 522/75 |
| 2014/0135413 A1 | 5/2014 | Yoo et al. | |
| 2015/0159059 A1 | 6/2015 | Zhang et al. | |

FOREIGN PATENT DOCUMENTS

| | | | | |
|---|---|---|---|---|
| JP | 2004-315663 | * | 11/2004 | .............. C08L 33/00 |
| KR | 10-2011-0119077 A | | 11/2011 | |
| KR | 10-2012-0080384 A | | 7/2012 | |
| KR | 10-2013-0016069 A | | 2/2013 | |
| KR | 10-2014-0065414 A | | 5/2014 | |

* cited by examiner

ADHESIVE COMPOSITION AND DISPLAY DEVICE

CROSS-REFERENCE TO RELATED APPLICATION

This application claims priority to and the benefit of Korean Patent Application No. 10-2015-0102478, filed on Jul. 20, 2015, in the Korean Intellectual Property Office, the entire content of which is incorporated herein by reference.

BACKGROUND

1. Field

One or more aspects of example embodiments of the present disclosure relate to an adhesive composition and a display device manufactured using the adhesive composition.

2. Description of the Related Art

Electronic devices that provide images to users (such as smartphones, digital cameras, laptop computers, navigation units, and/or televisions ("TV")) may include display devices for displaying images. In general, a display device may include a display panel configured to generate images and display the images, and a window provided above the display panel to protect the display panel. In this case, the display panel and the window adhere to one another by an adhesive layer.

For example, the display panel and the window may adhere to one another by an adhesive composition, and the adhesive composition may undergo curing with light such as ultraviolet ("UV") light. In this process, any portion of the adhesive composition that is not sufficiently exposed to the light due to interference (e.g., by an apparatus and/or the like) may be insufficiently cured. The non-cured portion of the adhesive composition may permeate into a light shielding layer to thereby cause discoloration of the light shielding layer and/or deteriorate adhesion between the window and the display panel.

Accordingly, there is a need to reduce or effectively prevent the non-curing of the adhesive composition.

It is to be understood that this section is intended to provide useful background for understanding the technology related to the present disclosure and as such, the background section may include ideas, concepts, or recognitions that were not part of what was known or appreciated by those skilled in the art prior to the effective filing date of the subject matter disclosed herein.

SUMMARY

One or more aspects of example embodiments of the present disclosure are directed to a photo-curable and thermally curable (e.g., thermosetting) adhesive composition.

Additional aspects of example embodiments of the present disclosure are directed to a display device using an adhesive layer including the photo-curable and thermally curable (e.g., thermosetting) adhesive composition.

According to an example embodiment of the present disclosure, an adhesive composition includes, with respect to the total weight of the adhesive composition: a binder in an amount of about 65 percent by weight (wt %) to about 80 wt %; a reactive monomer in an amount of about 15 wt % to about 25 wt %; a photopolymerization initiator in an amount of about 1 wt % to about 10 wt %; a thermal polymerization initiator in an amount of about 0.5 wt % to about 1 wt %; and a curing accelerator in an amount of about 0.1 wt % to about 0.5 wt %, wherein the curing accelerator includes a metallic acrylate (e.g., an metal-containing acrylate compound).

The reactive monomer may be a polymerizable acrylate-based compound including a methoxy group and/or an ethoxy group.

The reactive monomer may include, as a functional group that reacts with the photopolymerization initiator, at least one selected from an acrylate having a carbon-carbon double bond, a methacrylate group, an allyl group, a vinyl group, an alkene group, an alkyne group, an oxirane group, an oxetane group, a lactam group, and a furfuryl group.

The reactive monomer may include, as a functional group that reacts with the thermal polymerization initiator, at least one selected from an acrylate having a carbon-carbon double bond, a methacrylate group, an allyl group, a vinyl group, an alkene group, an alkyne group, an oxirane group, an oxetane group, a lactam group, a furfuryl group, an isocyanate group, an acrylic acid group, and an aziridine group.

The binder may be an acrylate-based compound having an unsaturated carbon-carbon double bond.

The thermal polymerization initiator may initiate thermal polymerization at a temperature of about 70 degrees Celsius (° C.) or less.

The thermal polymerization initiator may be at least one selected from ketone peroxide initiators, hydroperoxide initiators, peroxyester initiators, dialkyl peroxide initiators, methoxy butylperoxy dicarbonate, di-(2,4-dichlorobenzoyl)-peroxide, dibenzoyl peroxide, t-butyl peroxybenzoate, 1,1-di-(t-butylperoxy)-3,3,5-trimethylcyclohexane, dicumyl peroxide, di-(2-t-butylperoxy isopropyl)benzene, t-butyl-cumylperoxide, di-t-butylperoxide, azo(bis)isobutyronitrile (e.g., AIBN), azo(bis)carbonamide (e.g., azo(bis)formamide), and azo(bis)alkanonitrile initiators.

The curing accelerator may be represented by Chemical Formula 2:

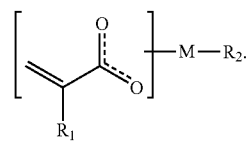

Chemical Formula 2

In Chemical Formula 2, M may be a metal, and $R_3$ and $R_4$ may each independently be selected from hydrogen and a hydrocarbon group having 1 to 6 carbon atoms.

The curing accelerator may be represented by Chemical Formula 3:

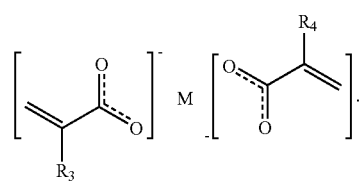

Chemical Formula 3

In Chemical Formula 3, M may be a metal, and $R_3$ and $R_4$ may each independently be selected from hydrogen and a hydrocarbon group having 1 to 6 carbon atoms.

The curing accelerator may be represented by Chemical Formula 4:

Chemical Formula 4

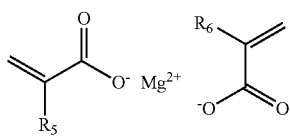

In Chemical Formula 4, $R_5$ and $R_6$ may each independently be selected from hydrogen and a hydrocarbon group having 1 to 6 carbon atoms.

One or more aspects of example embodiment of the present disclosure provide a display device including: a display panel; a window on a surface of the display panel; and an adhesive layer between the display panel and the window, wherein the adhesive layer includes, with respect to the total weight of the adhesive composition: a binder in an amount of about 65 percent by weight (wt %) to about 80 wt %; a reactive monomer in an amount of about 15 wt % to about 25 wt %; a photopolymerization initiator in an amount of about 1 wt % to about 10 wt %; a thermal polymerization initiator in an amount of about 0.5 wt % to about 1 wt %; and a curing accelerator in an amount of about 0.1 wt % to about 0.5 wt %, wherein the curing accelerator includes a metallic acrylate (e.g., an metal-containing acrylate compound).

The reactive monomer may be a polymerizable acrylate-based compound including a methoxy group and/or an ethoxy group.

The reactive monomer may include, as a functional group that reacts with the photopolymerization initiator, at least one selected from an acrylate having a carbon-carbon double bond, a methacrylate group, an allyl group, a vinyl group, an alkene group, an alkyne group, an oxirane group, an oxetane group, a lactam group, and a furfuryl group.

In some embodiments, the reactive monomer may include, as a functional group that reacts with the thermal polymerization initiator, at least one selected from an acrylate having a carbon-carbon double bond, a methacrylate group, an allyl group, a vinyl group, an alkene group, an alkyne group, an oxirane group, an oxetane group, a lactam group, a furfuryl group, an isocyanate group, an acrylic acid group, and an aziridine group.

The binder may be an acrylate-based compound having an unsaturated carbon-carbon double bond.

The thermal polymerization initiator may initiate thermal polymerization at a temperature of about 70° C. or less.

The thermal polymerization initiator may be at least one selected from ketone peroxide initiators, hydroperoxide initiators, peroxyester initiators, dialkyl peroxide initiators, methoxy butylperoxy dicarbonate, di-(2,4-dichlorobenzoyl)-peroxide, dibenzoyl peroxide initiators, t-butyl peroxybenzoate, 1,1-di-(t-butylperoxy)-3,3,5-trimethylcyclohexane, dicumyl peroxide, di-(2-t-butylperoxy isopropyl) benzene, t-butylcumylperoxide, di-t-butylperoxide, azo(bis) isobutyronitrile (e.g., AIBN), azo(bis)carbonamide (e.g., azo (bis)formamide), and azo(bis)alkanonitrile initiators.

The curing accelerator may be represented by Chemical Formula 2:

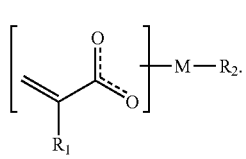

Chemical Formula 2

In Chemical Formula 2, M may be a metal, and $R_3$ and $R_4$ may each independently be selected from hydrogen and a hydrocarbon group having 1 to 6 carbon atoms.

The curing accelerator may be represented by Chemical Formula 3:

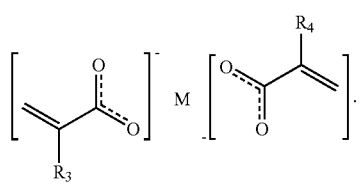

Chemical Formula 3

In Chemical Formula 3, M may be a metal, and $R_3$ and $R_4$ may each independently be selected from hydrogen and a hydrocarbon group having 1 to 6 carbon atoms.

The curing accelerator may be represented by Chemical Formula 4:

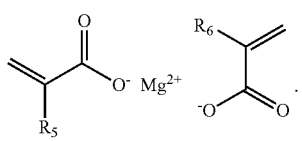

Chemical Formula 4

In Chemical Formula 4, $R_5$ and $R_6$ may each independently be selected from hydrogen and a hydrocarbon group having 1 to 6 carbon atoms.

The foregoing is illustrative only and is not intended to be in any way limiting. In addition to the illustrative example embodiments and features described above, further example embodiments and features will become apparent by reference to the drawings and the following detailed description.

BRIEF DESCRIPTION OF THE DRAWINGS

The above and other features and example embodiments of the present disclosure will be more clearly understood from the following detailed description, taken in conjunction with the accompanying drawings, in which.

DETAILED DESCRIPTION

Figure 1:
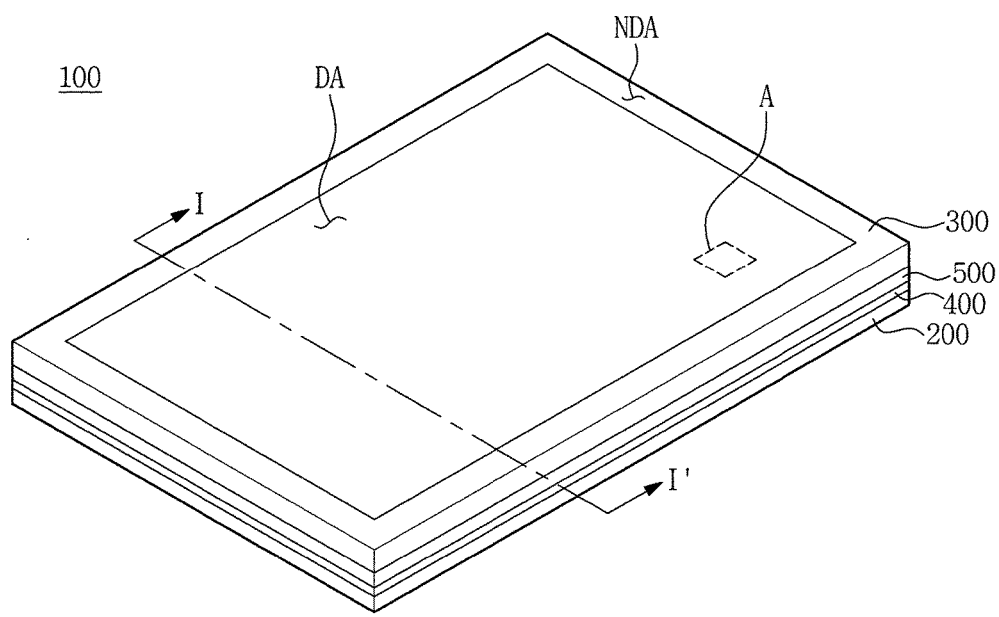
FIG. 1 is a perspective view illustrating an example embodiment of a display device.

Example embodiments of the present disclosure will now be described more fully hereinafter with reference to the accompanying drawings; however, the present disclosure may be embodied in different forms and should not be construed as being limited to the example embodiments set forth herein. Rather, these example embodiments are provided so that this disclosure will be thorough and complete, and will fully convey example implementations to those skilled in the art.

All terminologies used herein are merely used to describe example embodiments and may be modified according to the relevant art and the intention of an applicant. Therefore, the terms used herein should be interpreted as referring to what is consistent with their meanings in the context of the present disclosure, and is not intended to limit the example embodiments.

In the drawings, certain elements or shapes may be simplified or exaggerated to better illustrate the present disclosure, and other elements present in an actual product may not be shown. Thus, the drawings are intended to facilitate the understanding of the present disclosure. Like reference numerals refer to like elements throughout the specification, and duplicative descriptions thereof may not be provided.

When a layer or element is referred to as being "on" another layer or element, the layer or element may be directly on the other layer or element, or one or more intervening layers or elements may be interposed therebetween.

Hereinafter, an example embodiment of an adhesive composition will be described.

The adhesive composition according to an example embodiment of the present disclosure may include a binder, a reactive monomer, a photopolymerization initiator, a thermal polymerization initiator, and a curing accelerator.

The adhesive composition may include, with respect to the total weight of the adhesive composition: a binder in an amount of about 65 percent by weight (wt %) to about 80 wt %; a reactive monomer in an amount of about 15 wt % to about 25 wt %; a photopolymerization initiator in an amount of about 1 wt % to about 10 wt %; a thermal polymerization initiator in an amount of about 0.5 wt % to about 1 wt %; and a curing accelerator in an amount of about 0.1 wt % to about 0.5 wt %.

The binder may serve as a matrix for forming an adhesive layer using the adhesive composition, and may have an unsaturated carbon-carbon double bond for photo-curing. The binder may use at least one selected from an oligomer and a polymer.

For example, the binder may be selected from a (meth)acrylate resin having at least one (meth)acryloyl group in at least one molecule and a modified product thereof, an unsaturated polyester diallyl phthalate resin, a vinyl ester resin, a bis-maleimide resin, and modified products thereof. Non-limiting examples of the binder may include methyl (meth)acrylate, ethyl (meth)acrylate, butyl (meth)acrylate, isobutyl (meth)acrylate, 2-ethylhexyl (meth)acrylate, isooctyl (meth)acrylate, glycidyl (meth)acrylate, cyclohexyl (meth)acrylate, isobornyl (meth)acrylate, benzyl (meth)acrylate, 2-hydroxy (meth)acrylate, trimethoxybutyl (meth)acrylate, ethylcarbitol (meth)acrylate, phenoxyethyl (meth)acrylate, 2-hydroxyethyl (meth)acrylate, trimethylolpropane tri(meth)acrylate, tetramethylolmethane tetra(meth)acrylate, pentaerythritol hexa(meth)acrylate, pentaerythritol tetra(meth)acrylate, dipentaerythritol monohydroxypenta(meth)acrylate, dipentaerythritol hexa(meth)acrylate, 1,4-butylene glycol di(meth)acrylate, 1,6-hexanediol di(meth)acrylate, polyethylene glycol di(meth)acrylate, oligoester (meth)acrylate, multifunctional urethane (meth)acrylate, and urea acrylate.

The weight average molecular weight (Mw) of the binder may be about 5,000 to about 50,000. When the weight average molecular weight (Mw) of the binder exceeds 50,000, adhesion at an interface between the adhesive composition and an adherend may be relatively low, and white turbidity may occur in the adhesive composition under high-temperature and/or high-humidity conditions. When the weight average molecular weight (Mw) of the binder is below 5,000, maintaining a solid state of the adhesive composition may be difficult at room temperature. As used herein, the term "weight average molecular weight (Mw)" refers to a weight average molecular weight (Mw) calculated in terms of polystyrene on the basis of measurements by gel permeation chromatography ("GPC").

In an example embodiment, the binder may use urethane (meth)acrylate. Urethane (meth)acrylate may be prepared by the reaction of a polyol compound having two or more hydroxyl groups per molecule, a compound having two or more isocyanate groups per molecule, and (meth)acrylate having one or more hydroxyl groups per molecule.

Non-limiting examples of the polyol compound having two or more hydroxyl groups per molecule may include polyether polyol, polyester polyol, caprolactone diol, bisphenol polyol, polyisoprene polyol, hydrogenated polyisoprene polyol, polybutadiene polyol, hydrogenated polybutadiene polyol, castor oil polyol, polycarbonate diol, and the like, which may be used alone and/or in combinations of two or more thereof. As used herein, the terms "combination", "combination thereof" and "combinations thereof" may refer to a chemical combination (e.g., an alloy or chemical compound), a mixture, or a laminated structure of components.

Non-limiting examples of the compound having two or more isocyanate groups per molecule may include aromatic polyisocyanate, alicyclic polyisocyanate, aliphatic polyisocyanate, and the like, which may be used alone and/or in combinations of two or more thereof.

Non-limiting examples of the (meth)acrylate having one or more hydroxyl groups per molecule may include a mono(meth)acrylate of a dihydric alcohol (such as ethylene glycol, propylene glycol, 1,3-propanediol, 1,3-butanediol, 1,4-butanediol, and/or polyethylene glycol); a mono(meth)acrylate of a trihydric alcohol (such as trimethylolethane, trimethylolpropane, and/or glycerin); di(meth)acrylate, and the like, which may be used alone and/or in combinations of two or more thereof.

The binder may be included in the adhesive composition in an amount of about 65 wt % to about 80 wt % with respect to the total weight of the adhesive composition. When the amount of the binder is about 65 wt % to about 80 wt %, curing of the adhesive composition may be readily performed, and the adhesive layer that is formed by the curing of the adhesive composition may have suitable levels of hardness and flexibility.

The reactive monomer may be a compound including a functional group that enables the adhesive composition to perform both photo-curing and thermal curing. For example, the reactive monomer may include a functional group corresponding to (e.g., reacting with) a photopolymerization initiator and a functional group corresponding to a thermal polymerization initiator.

The functional group reacting with the photopolymerization initiator may include one selected from an acrylate having a carbon-carbon double bond, a methacrylate group, an allyl group, a vinyl group, an alkene group, an alkyne group, an oxirane group, an oxetane group, a lactam group, and a furfuryl group.

The functional group reacting with the thermal polymerization initiator may include one selected from an acrylate having a carbon-carbon double bond, a methacrylate group, an allyl group, a vinyl group, an alkene group, an alkyne group, an oxirane group, an oxetane group, a lactam group, a furfuryl group, an isocyanate group, an acrylic acid group, and an aziridine group.

In some embodiments, the reactive monomer may be a polymerizable acrylate-based compound having a methoxy or ethoxy group represented by Chemical Formula 1:

Chemical Formula 1

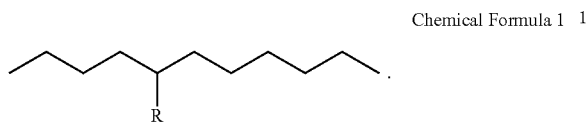

In Chemical Formula 1, R may be C=CC(O)X, wherein X may be selected from $OCH_3$ and $OCH_2CH_3$.

The compound having the methoxy or ethoxy group may be self-curable by heat according to the following Reaction Formula 1 and/or Reaction Formula 2. Based on this thermal curing property of the compound having the methoxy or ethoxy group, an additional process of thermal curing may be induced in the polymerizable acrylate-based compound subsequent to a photo-curing process. In this regard, the reactive monomer may undergo double curing, which includes photo-curing and thermal curing of the adhesive composition, and this may enhance curing density:

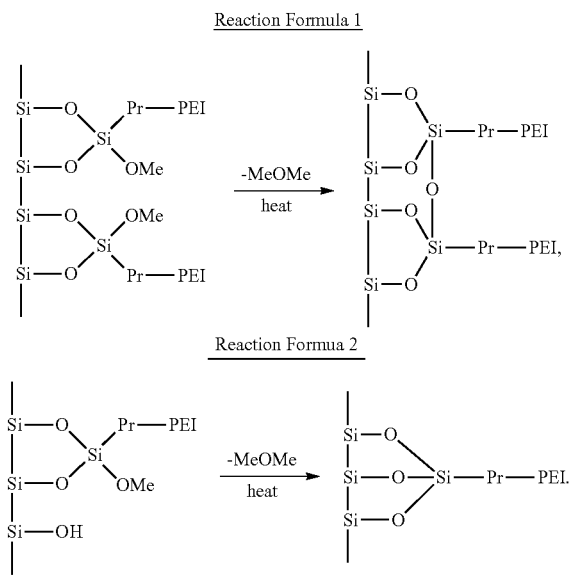

Such a reactive monomer may be used alone and/or in combination of two or more thereof. When used with the binder according to an example embodiment of the present disclosure, the reactive monomer may serve to enhance adhesion.

Non-limiting examples of the reactive monomer may include 2-hydroxyethyl acrylate, 2-hydroxyethyl methacrylate, 2-hydroxypropyl acrylate, 2-hydroxypropyl methacrylate, 2-hydroxybutyl acrylate, beta-carboxyethyl acrylate, dimethylacrylamide, acrylic acid, methacrylic acid, 2-hydroxyethyl methacrylate, dimethylacrylamide, and the like.

The reactive monomer may be included in the adhesive composition in an amount of about 15 wt % to about 25 wt % with respect to the total weight of the adhesive composition. When the amount of the reactive monomer is about 15 wt % to about 25 wt %, the curing of the adhesive composition by exposure may be readily performed, and thermal curing reaction may be readily performed. When the amount of the reactive monomer is below 15 wt %, curing efficiency may deteriorate. When the amount of the reactive monomer exceeds 25 wt %, the hardness of the adhesive layer that is formed by the curing of the adhesive composition may deteriorate.

The photopolymerization initiator absorbs activation energy rays such as ultraviolet ("UV") rays and may react with the reactive monomer and the binder to thereby initiate a polymerization reaction. In addition to the polymerization reaction, a cross-linking reaction may occur between the reactive monomer and the binder. The adhesive composition is cured via the polymerization and cross-linking reactions. Accordingly, the adhesive composition is cured to form an adhesive layer.

The type or kind of photopolymerization initiator is not particularly limited, and any suitable photopolymerization initiator available in the related art for use in a light-transmissive adhesive composition may be employed. Non-limiting examples of the photopolymerization initiator may include an acetophenone-based photopolymerization initiator, a benzoin-based photopolymerization initiator, a benzophenone-based photopolymerization initiator, and the like. The photopolymerization initiator may be used alone and/or in combination of two or more thereof.

Non-limiting examples of the acetophenone-based photopolymerization initiator may include diethoxyacetophenone, 2-hydroxy-2-methyl-1-phenylpropane-1-one, benzyl dimethylketal, 4-(2-hydroxy ethoxy)phenyl-(2-hydroxy-2-propyl)ketone, 1-hydroxycyclohexylphenylketone, 2-methyl-2-morpholino(4-thiomethylphenyl)propane-1-one, 2-benzyl-2-dimethylamino-1-(4-morpholinophenyl)butanone, 2-hydroxy-2-methyl-1-[4-(1-methylvinyl)phenyl] propanone, and the like.

Non-limiting examples of the benzoin-based photopolymerization initiator may include benzoin, benzoin methyl ether, benzoin ethyl ether, benzoin isopropyl ether, benzoin isobutyl ether, and the like.

Non-limiting examples of the benzophenone-based photopolymerization initiator may include benzophenone, methyl-o-benzoyl benzoate, 4-phenylbenzophenone, 4-benzoyl-4'-methyl-diphenylsulfide, 3,3',4,4'-tetra(t-butylperoxycarbonyl)benzophenone, 2,4,6-trimethylbenzophenone, 4-benzoyl-N,N-dimethyl-N-[2-(1-oxo-2-prophenyloxy) ethyl]benzene metanaminium bromide, (4-benzoylbenzyl) trimethyl ammonium chloride, and the like.

The photopolymerization initiator may be included in the adhesive composition in an amount of about 1 wt % to about 10 wt % with respect to the total weight of the adhesive composition. When the amount of the photopolymerization initiator is below 1 wt %, the photo-curing ability of the adhesive composition may deteriorate. When the amount of the photopolymerization initiator exceeds 10 wt %, the adhesive properties and the curing property of the adhesive composition may deteriorate due to excessive cross-linking density during rapid photo-curing.

The thermal polymerization initiator may react with one of the functional groups included in the reactive monomer that corresponds to the thermal polymerization initiator to thereby cure the reactive monomer. The thermal polymerization initiator may initiate thermal polymerization at a temperature of about 70 degrees Celsius (° C.) or lower. For example, a thermal polymerization initiator having a 10-hour half-life temperature of about 40° C. or lower may be employed to provide a curing temperature of about 70° C. or lower.

The thermal polymerization initiator may use at least one selected from organic peroxide and an organic nitrogen compound, but embodiments of the present disclosure are not limited thereto. Non-limiting examples of the thermal polymerization initiator may include at least one selected from ketone peroxide initiators including methylisobutylketone, hydroperoxide initiators including ted-butyl hydroperoxide, peroxyester initiators, dialkyl peroxide initiators, methoxybutyl peroxydicarbonate, di-(2,4-dichlorobenzoyl)-peroxide, dibenzoyl peroxide, t-butyl peroxybenzoate, 1,1-di-(t-butylperoxy)-3,3,5-trimethylcyclohexane, dicumyl peroxide, di-(2-t-butylperoxyisopropyl)benzene, t-butyl-cumyl peroxide, di-t-butylperoxide, azo(bis)isobutyronitrile, azo(bis)carbonamide, and azo(bis)alkanonitrile initiators.

The thermal polymerization initiator may be included in the adhesive composition in an amount of about 0.5 wt % to about 1 wt % with respect to the total weight of the adhesive composition. The thermal curing of the reactive monomer may be performed within the above range.

The curing accelerator may serve to accelerate photo-curing and thermal curing, for example, a double curing reaction.

According to an example embodiment, the curing accelerator may include a metallic acrylate (e.g., a metal-containing acrylate compound).

The curing accelerator may have a basic structure represented by Chemical Formula 2 and Chemical Formula 3:

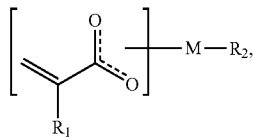

Chemical Formula 2

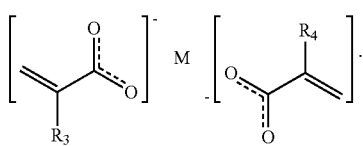

Chemical Formula 3

In Chemical Formulas 2 and 3, M may be metal, and $R_1$ to $R_4$ may each independently be selected from hydrogen and a hydrocarbon group having 1 to 6 carbon atoms. The type or kind of the metal M is not particularly limited, and non-limiting examples of substituents $R_1$ to $R_4$ may include a methyl group.

The metallic acrylate included in the curing accelerator has reactivity unique to acrylate, and may achieve relatively high adhesion to an adherend by using a metal having a core structure with a sufficient number of electrons. The curing accelerator may serve to enhance the overall curing density of the adhesive composition and enhance the curing reactivity thereof.

Examples of the metallic acrylate may include an acrylate compound including a magnesium (Mg) metal, as represented by the following Chemical Formula 4:

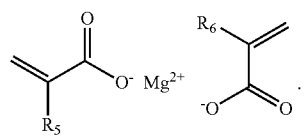

Chemical Formula 4

In Chemical Formula 4, $R_5$ and $R_6$ may each independently be selected from hydrogen and a hydrocarbon group having 1 to 6 carbon atoms.

The curing accelerator may be included in the adhesive composition in an amount of about 0.1 wt % to about 0.5 wt % with respect to the total weight of the adhesive composition. When the amount of the curing accelerator is below 0.1 wt %, accelerating the curing reaction may be difficult. When the amount of the curing accelerator exceeds 0.5 wt %, adhesive properties may deteriorate.

The adhesive composition according to an example embodiment of the present disclosure may enhance curability by including the photo-curable functional group corresponding to the photopolymerization initiator and the thermally curable functional group corresponding to the thermal polymerization initiator. In addition, the curing reactions may be performed at a relatively low temperature, and thus, curing may be performed using both heat and light generated by light irradiation without using an additional curing apparatus.

Hereinafter, another example embodiment of a display device will be described with reference to FIGS. 1, 2, 3, and 4. Duplicative descriptions of the components provided in the foregoing will not be provided.

An example embodiment of the display device will be explained with respect to an organic light emitting diode ("OLED") display device. However, the type or kind of display device is not limited thereto, and features of the present disclosure may also be applied to a liquid crystal display ("LCD") device, a plasma display panel ("PDP") device, a field emission display ("FED") device, and/or the like.

FIG. 1 is a perspective view illustrating an example embodiment of a display device 100.

Referring to FIG. 1, an upper planar surface of the display device 100 includes a display area DA, and a non-display area NDA around the display area DA. The display area DA may be defined as an area in which an image is displayed to an observer. The non-display area NDA may be defined as an area in which an image is not displayed. The non-display area NDA may be printed in black. However, the printing color of the non-display area NDA is not limited thereto, and the non-display area NDA may be printed in various colors other than black. For example, the non-display area NDA may be printed in white.

The upper planar surface of the display device 100 of FIG. 1 substantially corresponds to an upper planar surface of a window 300, and the description pertaining thereto will be provided below with reference to FIG. 2.

Figure 2:
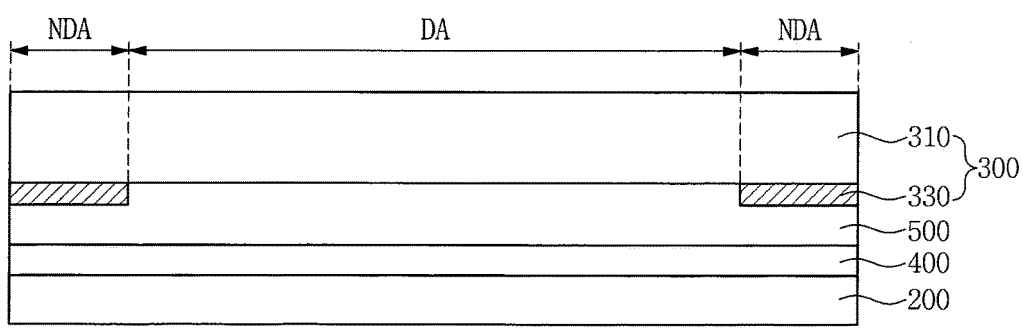
FIG. 2 is a cross-sectional view taken along line I-I' of FIG. 1.

FIG. 2 is a cross-sectional view taken along line I-I' of FIG. 1.

Referring to FIG. 2, the display device 100 includes a display panel 200, the window 300 above the display panel 200, and an adhesive layer 500 between the display panel 200 and the window 300.

The display panel 200 generates an image. The image generated in the display panel 200 is transmitted through the window 300 to be provided to a user.

The display panel 200 may use a self-emission-type (e.g., self-emission) display panel, such as an OLED display panel, or a non-emission-type (e.g., non-self-emission) display panel, such as an LCD panel or an electrophoretic display ("EPD") panel. A detailed description on the display panel 200 will be provided later with reference to FIG. 4.

The window 300 is above the display panel 200 to protect the display panel 200 from external scratches.

The window 300 includes a window base 310, and a light shielding layer 330 on one surface of the window base 310.

Similarly to the window 300, a planar surface of the window base 310 includes a display area DA and a non-display area NDA around the display area DA. The window base 310 faces the display panel 200.

The window base 310 may have a rectangular shape having substantially the same planar area as that of the display panel 200. However, the shape of the window base 310 is not limited thereto. In some example embodiments, the window base 310 may have one or more suitable shapes including rounded and/or curved corners.

The window base 310 may include a light-transmissive transparent film. Accordingly, the image generated in the display panel 200 may be transmitted through the display area DA of the window base 310 to be provided to a user.

The light shielding layer 330 may be positioned on a portion of a surface of the window base 310 that corresponds to the non-display area NDA, the window base 310 facing the display panel 200.

The light shielding layer 330 may include an organic material having a predetermined or set color. Accordingly, the color of the light shielding layer 330 on the non-display area NDA of the window base 310 may be provided to a user.

The light shielding layer 330 may prevent or reduce external visibility of a driver unit driving the display panel 200 and an accommodation unit accommodating the display panel 200.

The light shielding layer 330 may have various colors including black and/or white. When the light shielding layer 330 is black, the light shielding layer 330 may include a black matrix. When the light shielding layer 330 is white, the light shielding layer 330 may include an organic insulating material such as a white resin. In some example embodiments, the light shielding layer 330 may include an opaque inorganic insulating material (such as $CrO_x$ or $MoO_x$), and/or an opaque organic insulating material (such as a black resin). Accordingly, the light shielding layer 330 may serve to block light in the display panel 200 and/or prevent or reduce the visibility of an internal structure of the display panel 200, and may serve to determine the color of the window 300.

The light shielding layer 330 may have a monolayer structure; however, the structure of the light shielding layer 330 is not limited thereto. In some example embodiments, the light shielding layer 330 may have a multilayer structure including a plurality of layers having the same thickness and/or different thicknesses.

The light shielding layer 330 may be formed by printing a composition directly on the window base 310. In some example embodiments, the light shielding layer 330 may be formed by printing a composition on a transparent film, such as a polyethylene terephthalate ("PET") film, to form a light shielding layer, and then bonding the film with the light shielding layer to the window base 310. However, the manner of forming the light shielding layer 330 on a lower surface of the window base 310 is not limited to the aforementioned manner, and may include any suitable manner available in the pertinent art.

The light shielding layer 330 contacts the adhesive layer 500 between the display panel 200 and the window 300.

The adhesive layer 500 is between the display panel 200 and the window 300. The adhesive layer 500 serves to couple (e.g., bond) the display panel 200 and the window 300 to one another. The display panel 200 and the window 300 may be coupled by the adhesive layer 500 to be fixed to one another.

The adhesive layer 500 may be formed by curing the adhesive composition according to an example embodiment of the present disclosure. The adhesive layer 500 may include, in the adhesive composition, a binder, an adhesive polymer resin formed by polymerizing and cross-linking a reactive monomer, and a photopolymerization initiator and a thermal polymerization initiator that are not initially reacted and are dispersed in the adhesive polymer resin.

In a display device of the related art, non-curing may occur in a portion of an adhesive layer positioned below a light shielding layer that is not irradiated by light during photo-curing of the adhesive layer between a window and a display panel. The non-cured portion of the adhesive composition that remains in the adhesive layer may permeate into the light shielding layer to thereby cause discoloration of the light shielding layer.

There have been attempts to address the non-curing of the adhesive layer by forming an adhesive layer using an adhesive composition that performs double-curing, including photo-curing and thermal curing. For example, an adhesive layer may be formed by adding an additional resin or by using an adhesive composition having an epoxy structure or a phenolic structure. However, the adhesive composition having an epoxy structure or a phenolic structure may require a relatively high temperature above 100° C. and may require a relatively long period of time for thermal curing.

For example, Reaction Formula 3 represents a double curing reaction within an adhesive composition having an epoxy structure:

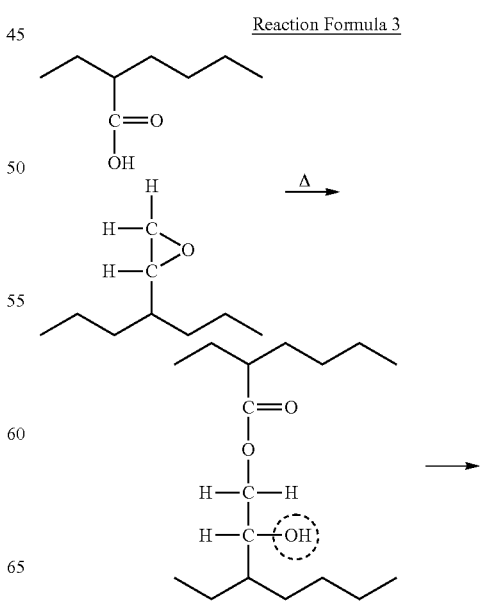

Reaction Formula 3

-continued

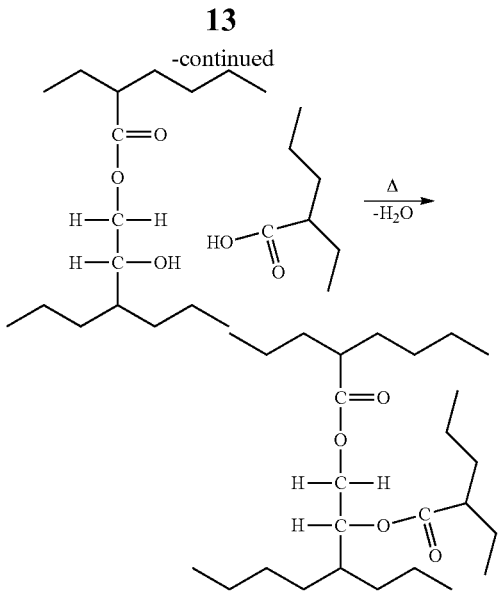

The double curing reaction by the epoxy reaction represented in Reaction Formula 3 requires a relatively high temperature above 120° C. and requires a relatively high energy, thus causing difficulty in the application thereof.

In the display device 100, the adhesive layer 500 includes an adhesive composition that is photo-curable and thermally curable (e.g., thermosetting), such that photo-curing and thermal curing may be sequentially and/or concurrently performed, thereby reducing or effectively preventing the non-curing of the adhesive layer 500.

Accordingly, the display device 100 may reduce or effectively prevent discoloration and delamination of the window 300 due to non-curing of the adhesive layer 500, and may reduce or effectively prevent the detachment of the adhesive layer 500. In such an embodiment, the adhesive layer 500 is cured at a temperature of about 70° C. or less, and thus, the display device 100 may be used in a temperature-sensitive module.

In some embodiments, a polarizer 400 is on the display panel 200, and in some embodiments, is between the display panel 200 and the adhesive layer 500. The polarizer 400 may convert an optical axis of light (e.g., induce polarization of the light) irradiated from the display panel 200.

The polarizer 400 may have the same size as the display panel 200 so as to cover the display panel 200. The polarizer 400 may have a monolayer structure and/or a multilayer structure including a polarizing film and a phase difference film.

Hereinafter, a pixel of the display panel 200 will be described in greater detail with reference to FIGS. 3 and 4.

Figure 3:
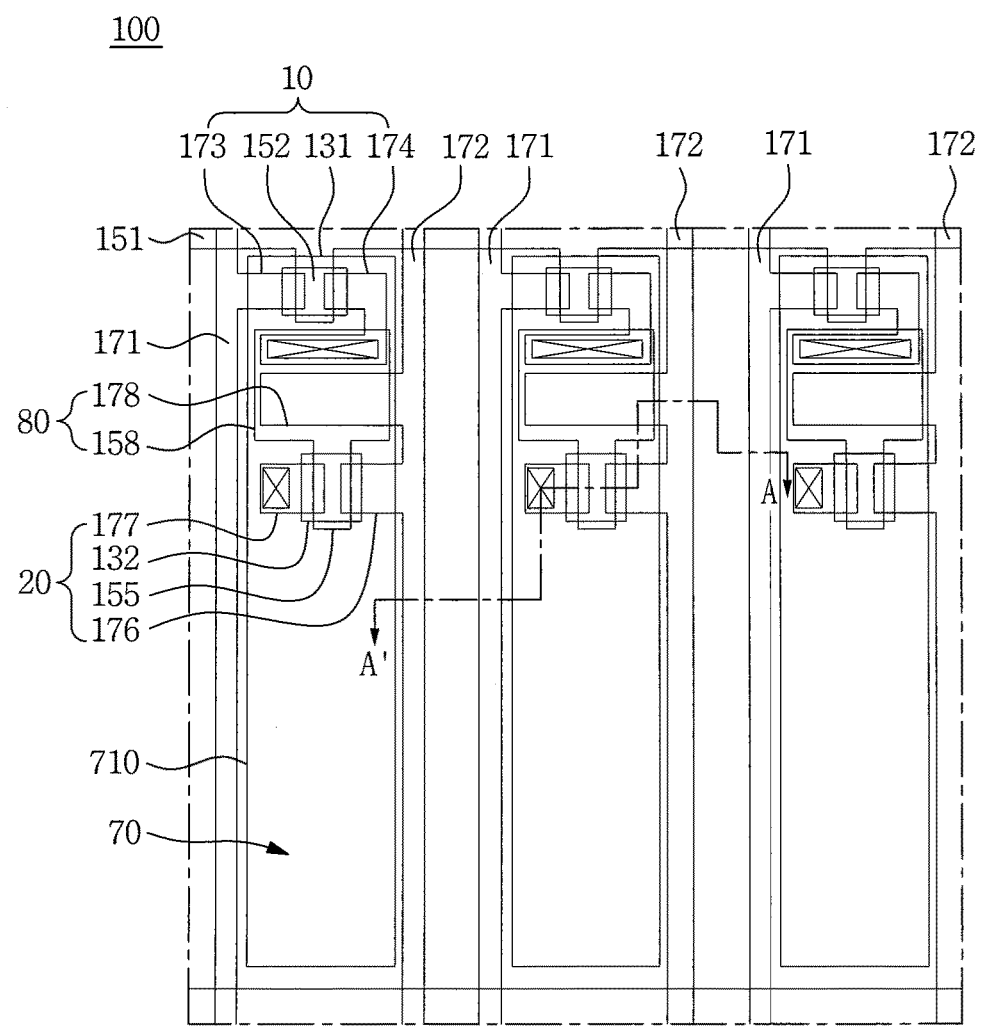
FIG. 3 is a plan view illustrating a pixel of a display panel in area "A" of FIG. 1.

FIG. 3 is a plan view illustrating a pixel of the display panel 200 in area "A" of FIG. 1. FIG. 4 is a cross-sectional view taken along line A-A' of FIG. 3.

Figure 4:
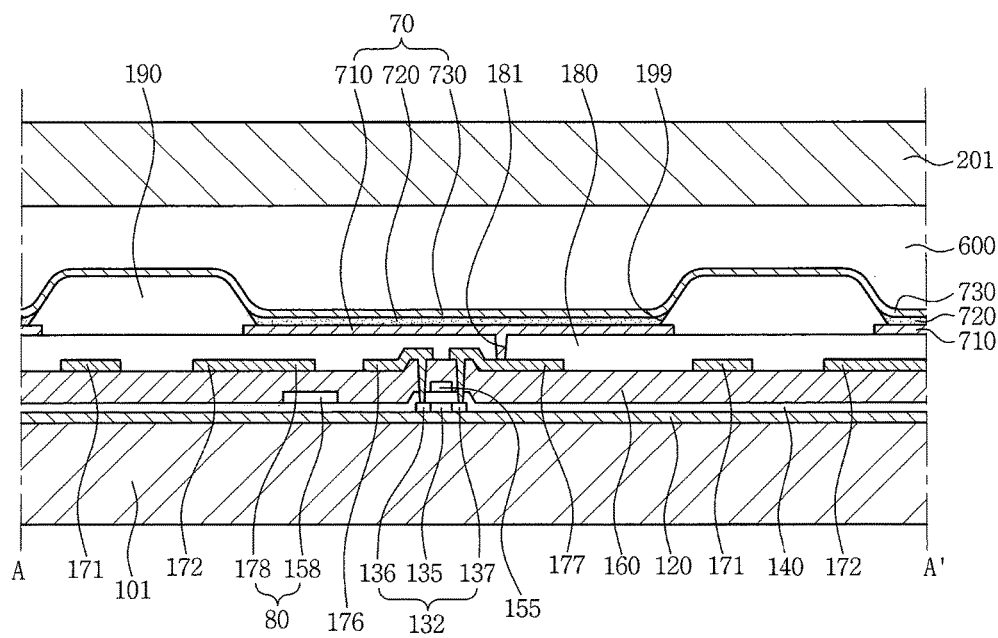
FIG. 4 is a cross-sectional view taken along line A-A' of FIG. 3.

Referring to FIGS. 3 and 4, the display device 100 is illustrated as an active matrix organic light emitting diode ("AMOLED") display device having a 2 transistor-1 capacitor (2Tr-1Cap) structure, in which a single pixel includes two thin film transistors ("TFT"), for example, a switching TFT 10 and a driving TFT 20, and a single capacitor, for example, a capacitor 80. However, example embodiments of the present disclosure are not limited thereto.

Accordingly, the OLED display device 100 may have any suitable structure, for example, a structure in which three or more TFTs and two or more capacitors are included in a pixel and additional wiring is further included. As used herein, the term "pixel" refers to a minimum unit for displaying an image, and the display area may display an image using a plurality of pixels.

The OLED display device 100 includes a first substrate 101; the switching TFT 10, the driving TFT 20, the capacitor 80, and an OLED 70 that are respectively formed in the plurality of pixels defined in the first substrate 101. The first substrate 101 further includes a gate line 151 extending in one direction, and a data line 171 and a common power line 172 intersecting (crossing) and insulated from the gate line 151.

In such an embodiment, each of the plurality of pixels may be defined by the gate line 151, the data line 171, and the common power line 172; however, the definition of the pixel is not necessarily limited thereto.

The OLED 70 may include a first electrode 710, an organic light emitting layer 720 on the first electrode 710, and a second electrode 730 on the organic light emitting layer 720. At least one first electrode 710 may be provided for each pixel, such that the first substrate 101 includes a plurality of first electrodes 710 spaced apart from one another.

In such an embodiment, the first electrode 710 may be a positive electrode (anode), for example, a hole injection electrode; and the second electrode 730 may be a negative electrode (cathode), for example, an electron injection electrode. However, the types or kinds of the first and second electrodes 710 and 730 is not limited thereto, and in some embodiments, the first electrode 710 may be a cathode and the second electrode 730 may be an anode, depending on the driving scheme of the OLED display device 100. In such an embodiment, the first electrode 710 is a pixel electrode, and the second electrode 730 is a common electrode.

A hole and an electron injected into the organic light emitting layer 720 may combine with one another to form an exciton. The OLED 70 emits light by energy generated when the exciton falls (e.g., transitions or decays) from an excited state to a ground state.

The capacitor 80 includes a pair of storage electrodes, for example, first and second storage electrodes 158 and 178 having an insulating layer 160 therebetween. In some embodiments, the insulating layer 160 may be a dielectric material. The capacitance of the capacitor 80 may be determined by the amount of electric charge stored in the capacitor 80 and the voltage across the first and second storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may be used as a switching element for selecting a pixel to emit light. The switching gate electrode 152 is connected to the gate line 151. The switching source electrode 173 is connected to the data line 171. The switching drain electrode 174 is spaced apart from the switching source electrode 173 and is connected to the first storage electrode 158.

The driving TFT 20 applies, to the first electrode 710, a driving power for emitting light from the organic light emitting layer 720 of the OLED 70 within the pixel selected by the switching TFT 10. The driving gate electrode 155 is connected to the first storage electrode 158 which is connected to the switching drain electrode 174. The driving source electrode 176 and the second storage electrode 178 are connected to the common power line 172.

The driving drain electrode 177 is connected to the first electrode 710 of the OLED 70 through a drain contact hole 181.

Due to the configuration of the switching TFT 10 and the driving TFT 20 as described above, the switching TFT 10 is operated by a gate voltage applied to the gate line 151, to thereby transmit a data voltage applied to the data line 171 to the driving TFT 20.

A voltage substantially equal to the difference between the common voltage applied by the common power line 172 to the driving TFT 20 and the data voltage transmitted by the switching TFT 10 may be stored in the capacitor 80. A current density corresponding to the voltage stored in the capacitor 80 may flow into the OLED 70 through the driving TFT 20, thereby enabling the OLED 70 to emit light.

Hereinafter, the configuration of the OLED display device 100 will be described in greater detail with reference to FIGS. 3 and 4.

The components illustrated in FIG. 4 including the OLED 70, the driving TFT 20, the capacitor 80, the data line 171, and the common power line 172 will be described below. The switching semiconductor layer 131, the switching gate electrode 152, the switching source electrode 173, and the switching drain electrode 174 of the switching TFT 10 have the same stacked structure as the driving semiconductor layer 132, the driving gate electrode 155, the driving source electrode 176, and the driving drain electrode 177 of the driving TFT 20, and thus, a duplicative description thereof will not be provided.

In an example embodiment, the first substrate 101 may be an insulating substrate including glass, quartz, ceramic, plastic, and/or the like. However, the material included in the first substrate 101 is not limited thereto, and the first substrate 101 may be a metallic substrate including stainless steel, and/or the like.

A buffer layer 120 is on the first substrate 101. The buffer layer 120 serves to prevent or reduce the infiltration of impurities into the first substrate 101 and to planarize a surface of the first substrate 101.

The buffer layer 120 may include at least one selected from silicon nitride ($SiN_x$), silicon oxide ($SiO_2$), and silicon oxynitride ($SiO_xN_y$). However, the buffer layer 120 is not required, and may be omitted depending on the type or kind of the first substrate 101, process conditions, and/or the like.

The driving semiconductor layer 132 is on the buffer layer 120. The driving semiconductor layer 132 may include at least one selected from polycrystalline silicon, amorphous silicon, and/or an oxide semiconductor. For example, the driving semiconductor layer 132 may include a channel region 135 that is not doped with impurities, and a source region 136 and a drain region 137 that are respectively doped with p-type materials on both sides of the channel region 135. The ions used for doping may be p-type impurities such as boron (B), and in some embodiments, diborane ($B_2H_6$) may be used. Such impurities may vary based on the type or kind of TFT.

A gate insulating layer 140 is on the driving semiconductor layer 132. The gate insulating layer 140 may include at least one selected from tetraethyl orthosilicate ("TEOS"), silicon nitride ($SiN_x$), and silicon oxide ($SiO_2$). For example, the gate insulating layer 140 may have a double-layer structure in which a $SiN_x$ layer having a thickness of about 40 nanometers (nm) and a TEOS layer having a thickness of about 80 nm are sequentially stacked. However, the structure of the gate insulating layer 140 is not limited thereto, and the gate insulating layer 140 may have any suitable structure.

The driving gate electrode 155, the gate line 151 (refer to FIG. 6), and the first storage electrode 158 are on the gate insulating layer 140. In such an embodiment, the driving gate electrode 155 overlaps at least a portion of the driving semiconductor layer 132, for example, the channel region 135. The driving gate electrode 155 serves to prevent or reduce impurities from being doped in the channel region 135 when the impurities are doped in the source region 136 and the drain region 137 of the driving semiconductor layer 132 during the formation of the driving semiconductor layer 132.

The driving gate electrode 155 and the first storage electrode 158 may be on the same layer and may include substantially the same metal. The driving gate electrode 155 and the first storage electrode 158 may include at least one selected from molybdenum (Mo), chromium (Cr), and tungsten (W). In an example embodiment, the driving gate electrode 155 and the first storage electrode 158 may include an alloy including Mo and/or a Mo alloy.

The insulating layer 160 is on the gate insulating layer 140 to cover the driving gate electrode 155. The insulating layer 160 may be an insulating interlayer. The insulating layer 160 may include silicon nitride ($SiN_x$) and/or silicon oxide ($SiO_2$), similarly to the gate insulating layer 140. Contact holes are defined in the gate insulating layer 140 and the insulating layer 160 so as to expose the source region 136 and the drain region 137 of the driving semiconductor layer 132 therethrough, respectively.

The driving source electrode 176, the driving drain electrode 177, the data line 171, the common power line 172, and the second storage electrode 178 are on the insulating layer 160 in the display area DA. The driving source electrode 176 and the driving drain electrode 177 are connected to the source region 136 and the drain region 137 of the driving semiconductor layer 132 through the contact holes, respectively.

Accordingly, the driving TFT 20 that includes the driving semiconductor layer 132, the driving gate electrode 155, the driving source electrode 176, and the driving drain electrode 177 is formed. However, the configuration of the driving TFT 20 is not limited to the aforementioned description, and may be modified to have any suitable structure.

A passivation layer 180 is on the insulating layer 160 to cover the driving source electrode 176, the driving drain electrode 177, and/or the like. The passivation layer 180 may include an organic material (such as polyacrylate, polyimide, and/or the like). The passivation layer 180 may be a planarization layer.

The passivation layer 180 may include at least one selected from a polyacrylate resin, an epoxy resin, a phenolic resin, a polyamide resin, a polyimide resin, an unsaturated polyester resin, a poly(phenylene ether) resin, a poly(phenylenesulfide) resin, and benzocyclobutene (BCB).

The drain contact hole 181 is defined in the passivation layer 180, and the driving drain electrode 177 is exposed through the drain contact hole 181.

The first electrode 710 is on the passivation layer 180, and is connected to the driving drain electrode 177 through the drain contact hole 181 of the passivation layer 180.

A pixel defining layer 190 is on the passivation layer 180 to cover the first electrode 710. An aperture 199 is defined in the pixel defining layer 190, and the first electrode 710 is exposed through the aperture 199.

In such an embodiment, the first electrode 710 is positioned to correspond to the aperture 199 of the pixel defining layer 190. The pixel defining layer 190 may include a resin such as a polyacrylate resin and/or a polyimide resin.

The organic light emitting layer 720 is positioned on the first electrode 710 within the aperture 199 of the pixel defining layer 190, and the second electrode 730 is on the pixel defining layer 190 and the organic light emitting layer 720.

As such, the OLED 70 includes the first electrode 710, the organic light emitting layer 720, and the second electrode 730.

One selected from the first electrode 710 and the second electrode 730 may include a transparent conductive material, and the other thereof may include a transflective conductive material and/or a reflective conductive material. The OLED display device 100 may act as one selected from a top-emission-type (e.g., top emission) display device, a bottom-emission-type (e.g., bottom emission) display device, and a both-side emission-type (e.g., both side emission) display device, depending on the type or kind of material included in the first and second electrodes 710 and 730.

In some example embodiments, when the OLED display device 100 is a top-emission-type (e.g., top emission) display device, the first electrode 710 may include a transflective and/or reflective conductive material, and the second electrode 730 may include a transparent conductive material.

The transparent conductive material may include at least one selected from indium-tin oxide ("ITO"), indium-zinc oxide ("IZO"), zinc oxide (ZnO), and indium oxide ($In_2O_3$). The reflective material may include at least one selected from lithium (Li), calcium (Ca), lithium fluoride/calcium (LiF/Ca), lithium fluoride/aluminum (LiF/Al), aluminum (Al), silver (Ag), magnesium (Mg), and gold (Au).

The organic light emitting layer 720 may include a low molecular weight organic material and/or a high molecular weight organic material. The organic light emitting layer 720 may have a multilayer structure including at least one selected from a light emitting layer, a hole injection layer ("HIL"), a hole transporting layer ("HTL"), an electron transporting layer ("ETL") and an electron injection layer ("EIL"). In an example embodiment, the HIL may be on the first electrode 710, which is a positive end, and the HTL, the light emitting layer, ETL, and EIL may be sequentially stacked thereon.

A capping layer may be on the second electrode 730. The capping layer may serve to protect the OLED 70 and help the light generated in the organic light emitting layer 720 to be efficiently emitted externally.

A second substrate 201 may be sealed and/or bonded to the first substrate 101 with the OLED 70 therebetween. The second substrate 201 covers and protects the switching TFT 10, the driving TFT 20, the OLED 70, and/or the like, which are on the first substrate 101, so that they are sealed from external influences. The second substrate 201 may use an insulating substrate including glass, plastic, and/or the like. In a case of a top-emission-type (e.g., top emission) display device in which an image is displayed toward the second substrate 201, the second substrate 201 may include a light-transmissive material.

A buffer material 600 is between the first substrate 101 and the second substrate 201. The buffer material 600 may protect internal components, such as the OLED 70, against external impacts applied to the OLED display device 100. Further, the buffer material 600 may enhance the mechanical reliability of the OLED display device 100. The buffer material 600 may include at least one organic sealant (such as a urethane resin, an epoxy resin, and/or an acrylic resin), and/or an inorganic sealant (such as silicon).

Figure 5:
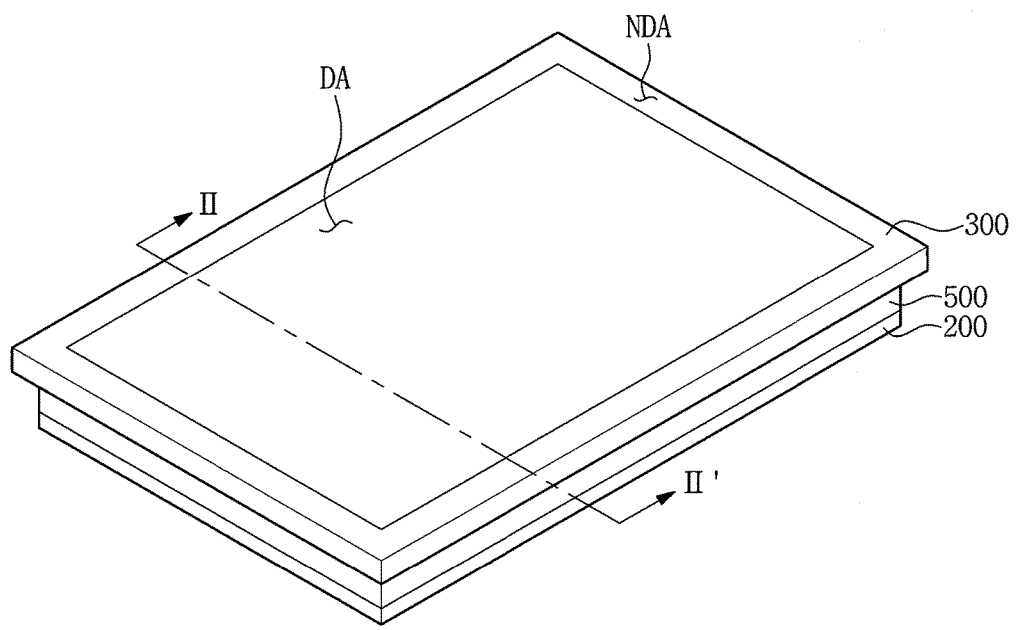
FIG. 5 is a perspective view illustrating another example embodiment of a display device.
Figure 6:
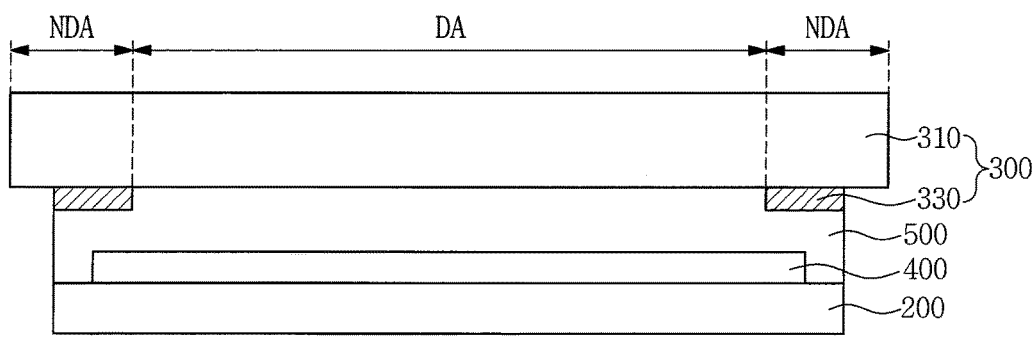
FIG. 6 is a cross-sectional view taken along line II-II' of FIG. 5.

FIG. 5 is a perspective view illustrating another example embodiment of a display device. FIG. 6 is a cross-sectional view taken along line II-II' of FIG. 5.

Referring to FIGS. 5 and 6, the display device of FIG. 5 has substantially the same configuration as the display device 100 of FIG. 1, except for a window 300 and a polarizer 400, and thus, a duplicative description of the configuration will not be repeated.

A window base 310 has a rectangular shape having a greater planar area than the display panel 200. However, the shape of the window base 310 is not limited thereto. In some example embodiments, the window base 310 may have any suitable shape including rounded and/or curved corner.

The polarizer 400 is positioned on the display panel 200 to cover at least a portion of the display panel 200. The polarizer 400 may have a monolayer structure and/or a multilayer structure including a polarizing film and a phase difference film.

As set forth above, according to one or more example embodiments, the adhesive composition may be both photocurable and thermally curable (e.g., thermosetting), thus enhancing the degree of curing thereof.

In such embodiments, the display device may use the adhesive layer including the aforementioned adhesive composition, thus reducing or effectively preventing discoloration of the light shielding layer and deterioration of adhesion.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the present disclosure.

As used herein, expressions such as "at least one of", "one of", "at least one selected from", and "one selected from", when preceding a list of elements, modify the entire list of elements and do not modify the individual elements of the list. Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The above-disclosed subject matter is to be considered illustrative and not restrictive, and the appended claims and equivalents thereof are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An adhesive composition comprising, with respect to a total weight of the adhesive composition:
   a binder in an amount of about 65 percent by weight (wt %) to about 80 wt %;
   a reactive monomer in an amount of about 15 wt % to about 25 wt %;
   a photopolymerization initiator in an amount of about 1 wt % to about 10 wt %;
   a thermal polymerization initiator in an amount of about 0.5 wt % to about 1 wt %; and
   a curing accelerator in an amount of about 0.1 wt % to about 0.5 wt %,
   wherein the curing accelerator comprises a metallic acrylate.

2. The adhesive composition of claim 1, wherein the reactive monomer comprises, as a functional group that reacts with the thermal polymerization initiator, at least one selected from an acrylate having a carbon-carbon double bond, a methacrylate group, an allyl group, a vinyl group, an alkene group, an alkyne group, an oxirane group, an oxetane group, a lactam group, a furfuryl group, an isocyanate group, an acrylic acid group, and an aziridine group.

3. The adhesive composition of claim 1, wherein the reactive monomer comprises, as a functional group that reacts with the photopolymerization initiator, at least one selected from an acrylate having a carbon-carbon double bond, a methacrylate group, an allyl group, a vinyl group, an alkene group, an alkyne group, an oxirane group, an oxetane group, a lactam group, and a furfuryl group.

4. The adhesive composition of claim 1, wherein the reactive monomer is a polymerizable acrylate-based compound comprising a methoxy group and/or an ethoxy group.

5. The adhesive composition of claim 1, wherein the binder is an acrylate-based compound having an unsaturated carbon-carbon double bond.

6. The adhesive composition of claim 1, wherein the curing accelerator is represented by Chemical Formula 2:

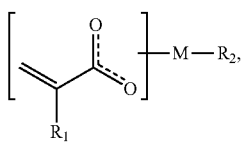

Chemical Formula 2 wherein M is a metal, and
$R_3$ and $R_4$ are each independently selected from hydrogen and a hydrocarbon group having 1 to 6 carbon atoms.

7. The adhesive composition of claim 1, wherein the curing accelerator is represented by Chemical Formula 3:

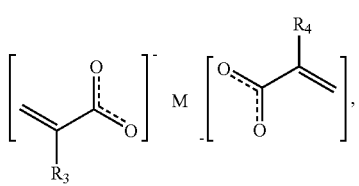

Chemical Formula 3 wherein M is a metal, and
$R_3$ and $R_4$ are each independently selected from hydrogen and a hydrocarbon group having 1 to 6 carbon atoms.

8. The adhesive composition of claim 1, wherein the curing accelerator is represented by Chemical Formula 4:

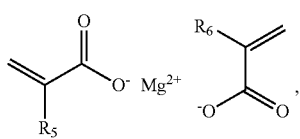

Chemical Formula 4 wherein $R_5$ and $R_6$ are each independently selected from hydrogen and a hydrocarbon group having 1 to 6 carbon atoms.

9. The adhesive composition of claim 1, wherein the thermal polymerization initiator initiates thermal polymerization at a temperature of about 70 degrees Celsius (° C.) or less.

10. The adhesive composition of claim 9, wherein the thermal polymerization initiator is at least one selected from ketone peroxide initiators, hydroperoxide initiators, peroxyester initiators, dialkyl peroxide initiators, methoxy butylperoxy dicarbonate, di-(2,4-dichlorobenzoyl)-peroxide, dibenzoyl peroxide, t-butyl peroxybenzoate, 1,1-di-(t-butylperoxy)-3,3,5-trimethylcyclohexane, dicumylperoxide, di-(2-t-butylperoxy isopropyl)benzene, t-butylcumylperoxide, di-t-butylperoxide, azo(bis)isobutyronitrile, azo(bis)carbonamide, and azo(bis)alkanonitrile.

11. A display device comprising:
a display panel;
a window on a surface of the display panel; and
an adhesive layer between the display panel and the window,
wherein the adhesive layer comprises, with respect to a total weight of the adhesive composition:
a binder in an amount of about 65 percent by weight (wt %) to about 80 wt %;
a reactive monomer in an amount of about 15 wt % to about 25 wt %;
a photopolymerization initiator in an amount of about 1 wt % to about 10 wt %;
a thermal polymerization initiator in an amount of about 0.5 wt % to about 1 wt %; and
a curing accelerator in an amount of about 0.1 wt % to about 0.5 wt %,
wherein the curing accelerator comprises a metallic acrylate.

12. The display device of claim 11, wherein the reactive monomer comprises, as a functional group that reacts with the thermal polymerization initiator, at least one selected from an acrylate having a carbon-carbon double bond, a methacrylate group, an allyl group, a vinyl group, an alkene group, an alkyne group, an oxirane group, an oxetane group, a lactam group, a furfuryl group, an isocyanate group, an acrylic acid group, and an aziridine group.

13. The display device of claim 11, wherein the reactive monomer comprises, as a functional group that reacts with the photopolymerization initiator, at least one selected from an acrylate having a carbon-carbon double bond, a methacrylate group, an allyl group, a vinyl group, an alkene group, an alkyne group, an oxirane group, an oxetane group, a lactam group, and a furfuryl group.

14. The display device of claim 11, wherein the reactive monomer is a polymerizable acrylate-based compound comprising a methoxy group and/or an ethoxy group.

15. The display device of claim 11, wherein the binder is an acrylate-based compound having an unsaturated carbon-carbon double bond.

16. The display device of claim 11, wherein the curing accelerator is represented by Chemical Formula 2:

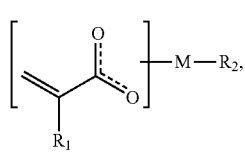

Chemical Formula 2 wherein M is a metal, and
$R_3$ and $R_4$ are each independently selected from hydrogen and a hydrocarbon group having 1 to 6 carbon atoms.

17. The display device of claim 11, wherein the curing accelerator is represented by Chemical Formula 3:

Chemical Formula 3

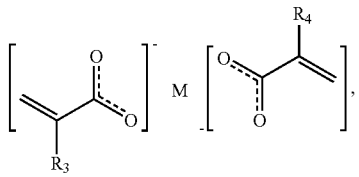

wherein M is a metal, and

R$_3$ and R$_4$ are each independently selected from hydrogen and a hydrocarbon group having 1 to 6 carbon atoms.

18. The display device of claim 11, wherein the curing accelerator is represented by Chemical Formula 4:

Chemical Formula 4

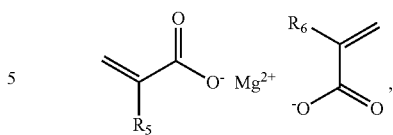

wherein R$_5$ and R$_6$ are each independently selected from hydrogen and a hydrocarbon group having 1 to 6 carbon atoms.

19. The display device of claim 11, wherein the thermal polymerization initiator initiates thermal polymerization at a temperature of about 70 degrees Celsius (° C.) or less.

20. The display device of claim 19, wherein the thermal polymerization initiator is at least one selected from ketone peroxide initiators, hydroperoxide initiators, peroxyester initiators, dialkyl peroxide initiators, methoxy butylperoxy dicarbonate, di-(2,4-dichlorobenzoyl)-peroxide, dibenzoyl peroxide, t-butyl peroxybenzoate, 1,1-di-(t-butylperoxy)-3,3,5-trimethylcyclohexane, dicumylperoxide, di-(2-t-butylperoxy isopropyl)benzene, t-butylcumylperoxide, di-t-butylperoxide, azo(bis)isobutyronitrile, azo(bis)carbonamide, and azo(bis)alkanonitrile initiators.

* * * * *